(12) United States Patent
Kiyota et al.

(10) Patent No.: US 9,835,297 B2
(45) Date of Patent: Dec. 5, 2017

(54) LIGHT EMITTING DEVICE HAVING A WAVELENGTH CONVERTER FIXED TO THE MOUNTING SURFACE

(71) Applicant: NICHIA CORPORATION, Anan-shi, Tokushima (JP)

(72) Inventors: Seiji Kiyota, Itano-gun (JP); Kazuma Kozuru, Anan (JP); Eiichiro Okahisa, Tokushima (JP)

(73) Assignee: NICHIA CORPORATION, Anan-shi, Tokushima ( * ) Notice: Subject to any disclaimer, the term of this patent is extended or adjusted under 35 U.S.C. 154(b) by 0 days.

(21) Appl. No.: 15/337,046

(22) Filed: Oct. 28, 2016

(65) Prior Publication Data

US 2017/0122505 A1    May 4, 2017

(30) Foreign Application Priority Data

Oct. 30, 2015 (JP) .................. 2015-214159

(51) Int. Cl.
| | | |
|---|---|---|
| *H01S 5/40* | (2006.01) | |
| *H01S 5/00* | (2006.01) | |
| *H01S 5/022* | (2006.01) | |
| *F21V 7/04* | (2006.01) | |
| *F21V 5/04* | (2006.01) | |
| *F21K 9/64* | (2016.01) | |
| *F21Y 115/30* | (2016.01) | |

(52) U.S. Cl.
CPC .............. *F21K 9/64* (2016.08); *F21V 5/04* (2013.01); *F21V 7/04* (2013.01); *H01S 5/005* (2013.01); *H01S 5/02236* (2013.01); *H01S 5/02276* (2013.01); *H01S 5/40* (2013.01); *F21Y 2115/30* (2016.08)

(58) Field of Classification Search
CPC ... F21K 9/64; H01S 5/40; H01S 5/005; H01S 5/02236; H01S 5/02276; F21V 5/04; F21V 7/04; F21Y 2115/30
See application file for complete search history.

(56) References Cited

FOREIGN PATENT DOCUMENTS

| JP | 2009-170723 A | 7/2009 |
|---|---|---|
| JP | 2014-154723 A | 8/2014 |
| JP | 2014-207378 A | 10/2014 |

*Primary Examiner* — Tracie Y Green
(74) *Attorney, Agent, or Firm* — Andrews Kurth Kenyon LLP

(57) ABSTRACT

A light emitting device includes a base defining a recess opening upward, a semiconductor laser element, a light reflecting member to reflect light from the semiconductor laser element, a wavelength converting member to convert wavelength of light from the light reflecting member, and a cover including a light-transmissive member and covering the opening of the recess. The recess is defined in the base by first inner lateral surfaces extending downward from a periphery of the opening of the recess defined in the upper surface of the base, a bottom surface connected to the first inner lateral surfaces, a mounting surface connected to the first inner lateral surfaces and located higher than the bottom surface in a region different from the bottom surface when viewed from above, and second inner lateral surfaces connecting the bottom surface and the mounting surface. The wavelength converting member is fixed on the mounting surface.

20 Claims, 13 Drawing Sheets

LIGHT EMITTING DEVICE HAVING A WAVELENGTH CONVERTER FIXED TO THE MOUNTING SURFACE

CROSS-REFERENCE TO RELATED PATENT APPLICATION

This application claims the benefit of Japanese Patent Application No. 2015-214159 filed on Oct. 30, 2015. The entire disclosure of Japanese Patent Application No. 2015-214159 is incorporated by reference herein.

BACKGROUND

Technical Field

The present disclosure relates to a light emitting device.

Description of Related Art

Light emitting devices including a cap, a wavelength converting member, a laser element, and a base has been proposed. See, for example, Japanese unexamined patent application publication No. 2014-154723.

SUMMARY

Such light emitting devices as described above have room for further improvement in miniaturization. Also, in such light emitting devices, the wavelength converting member may be detached from the cap when subjected to shaking or the like, and the laser light emitted from the laser element may be directly emitted to the outside of the light emitting device without passing through the wavelength converting member.

Such disadvantage can be overcome according to certain embodiments of the present invention as described below. A light emitting device includes a base defining a recess opening upward, a semiconductor laser element arranged on a bottom surface of the recess, a light reflecting member arranged on the bottom surface of the recess and configured to reflect light from the semiconductor laser element, a wavelength converting member configured to convert wavelength of light from the light reflecting member, and a cover covering the opening of the recess and including a light-transmissive member configured to transmit light from the wavelength converting member. The recess of the base is defined by first inner lateral surfaces extending downward from a periphery of the opening of the recess defined in an upper surface of the base, a bottom surface connected to the first inner lateral surfaces, a mounting surface located in a region different from the bottom surface when viewed from above, the mounting surface being connected to the first inner lateral surfaces and located higher than the bottom surface, and second inner lateral surfaces connecting the bottom surface and the mounting surface. The wavelength converting member is fixed on the mounting surface.

According to the light emitting device described above, a small-type light emitting device with high safety can be provided.

DETAILED DESCRIPTION

Light Emitting Device according to First Embodiment

Figure 1A:
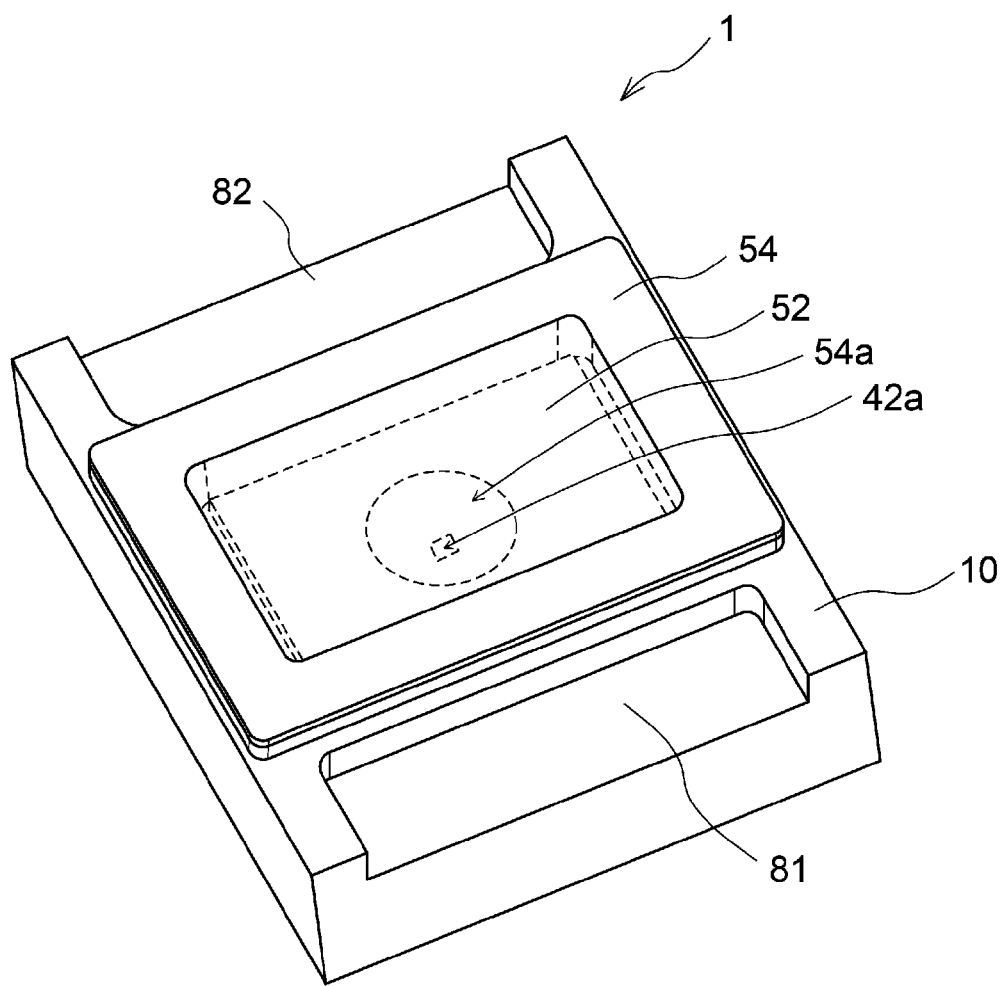
FIG. 1A is a schematic perspective view of a light emitting device according to a first embodiment.
Figure 1B:
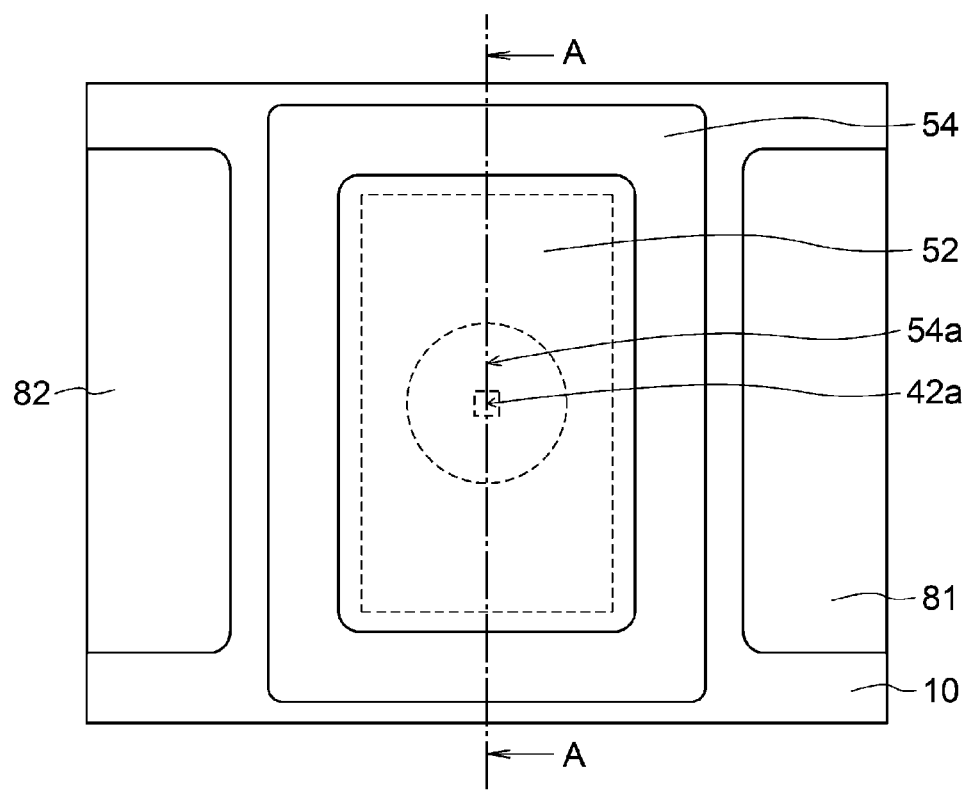
FIG. 1B is a schematic top view of the light emitting device according to the first embodiment.
Figure 1C:
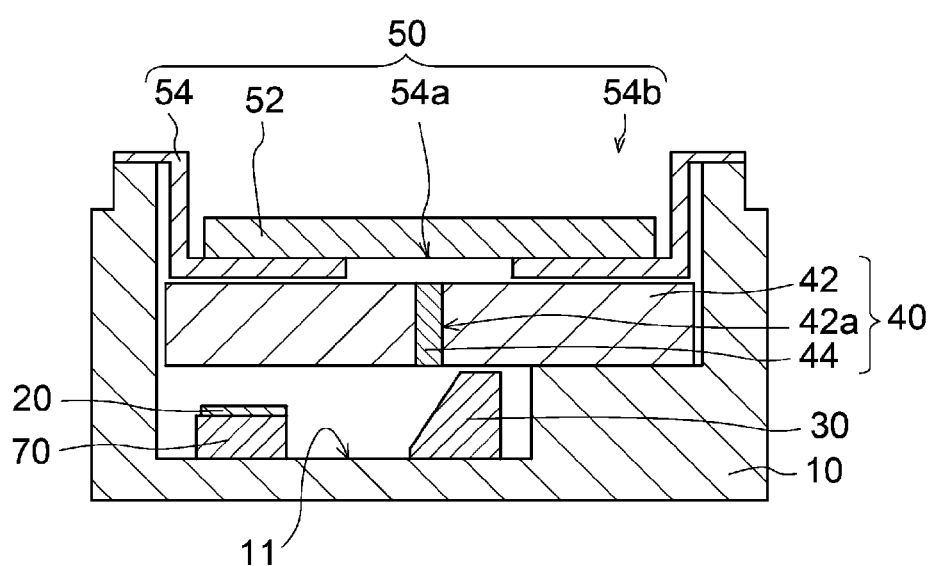
FIG. 1C is a schematic cross sectional view taken along line A-A in FIG. 1B.
Figure 2A:
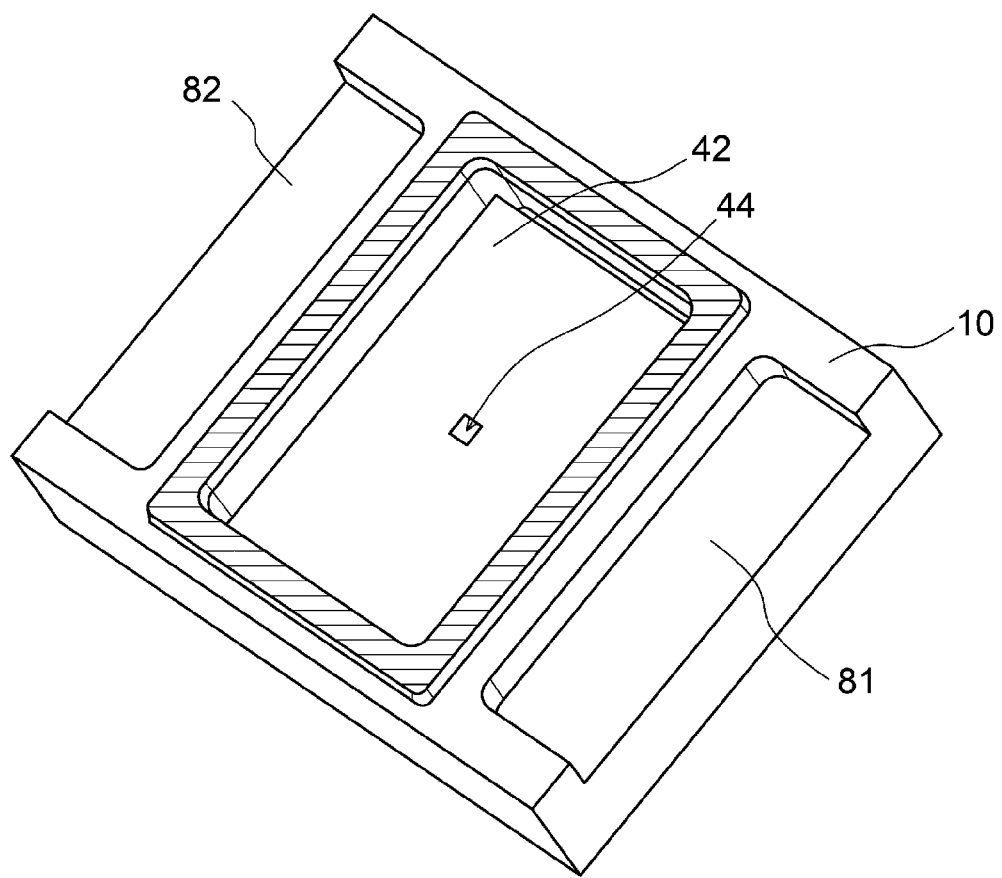
FIG. 2A is a schematic perspective view of the light emitting device according to the first embodiment (in which illustration of a cover is omitted).
Figure 2B:
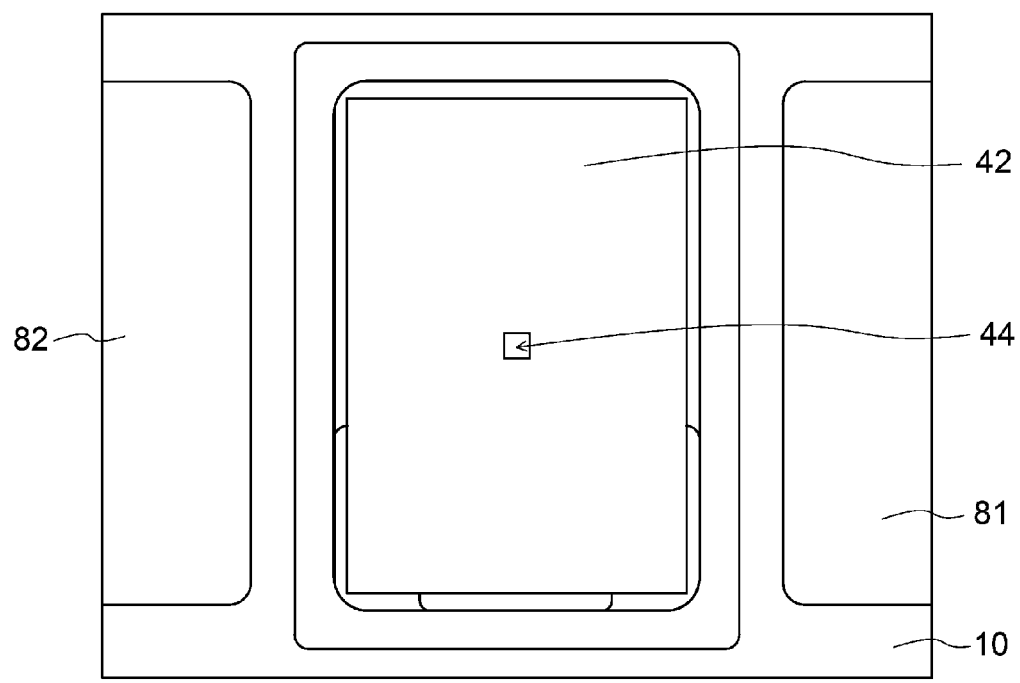
FIG. 2B is a schematic top view of the light emitting device according to the first embodiment (in which illustration of a cover is omitted).
Figure 3A:
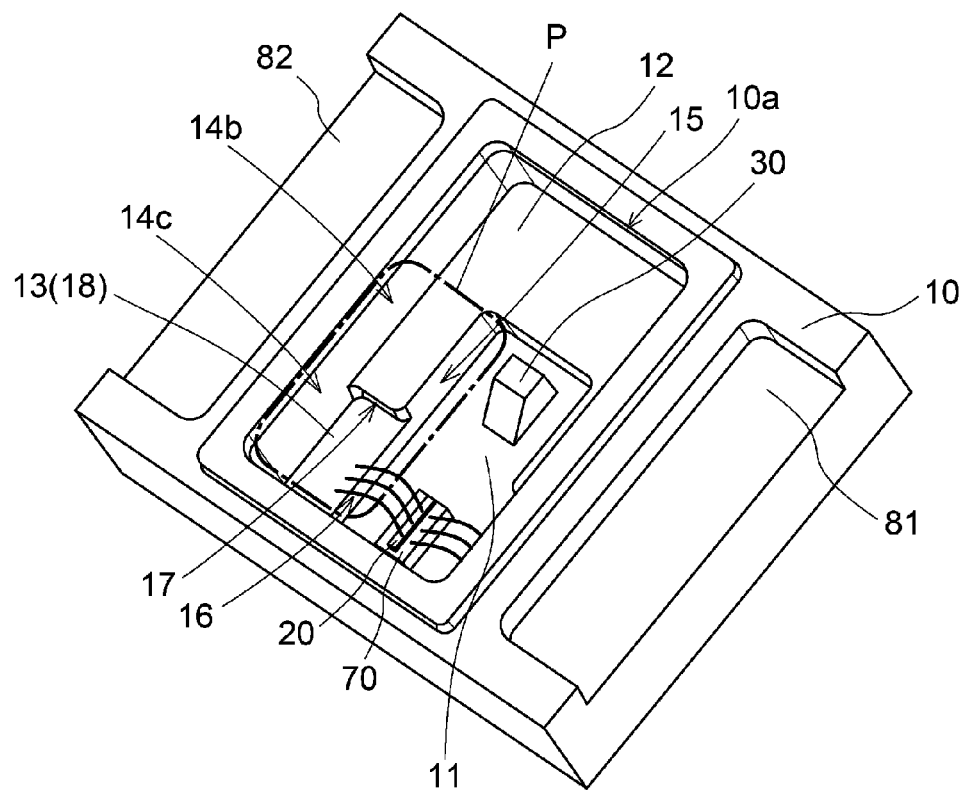
FIG. 3A is a schematic perspective view of the light emitting device according to the first embodiment (in which illustration of a cover and a wavelength converting member are omitted).
Figure 3B:
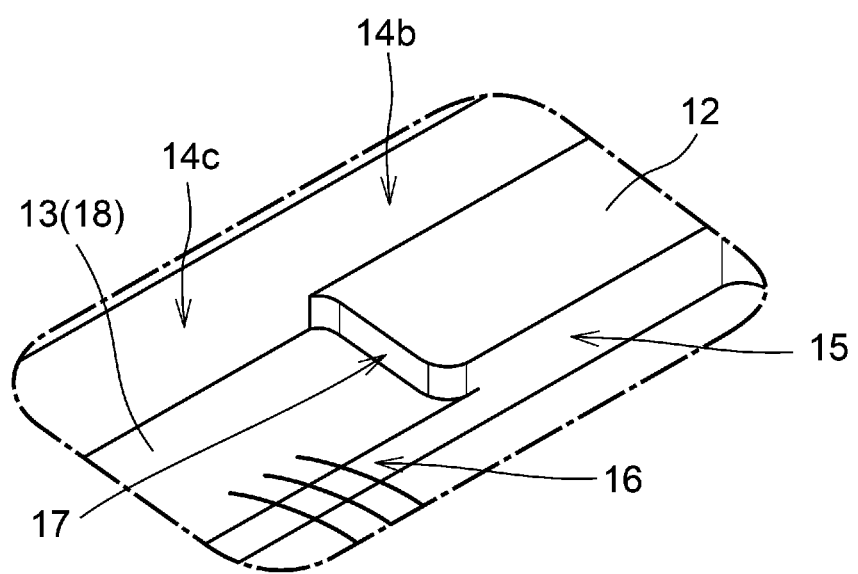
FIG. 3B is an enlarged view showing a section indicated by P in FIG. 3A.
Figure 3C:
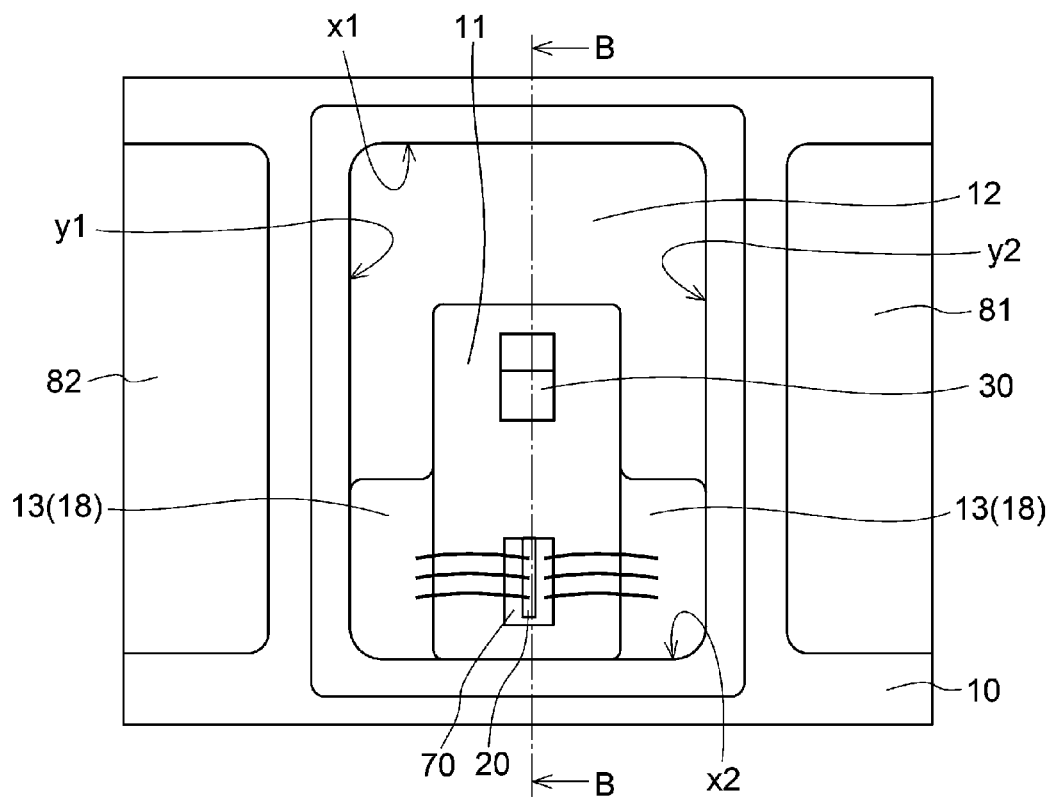
FIG. 3C is a schematic top view of the light emitting device according to the first embodiment (in which illustration of a cover and a wavelength converting member are omitted).
Figure 3D:
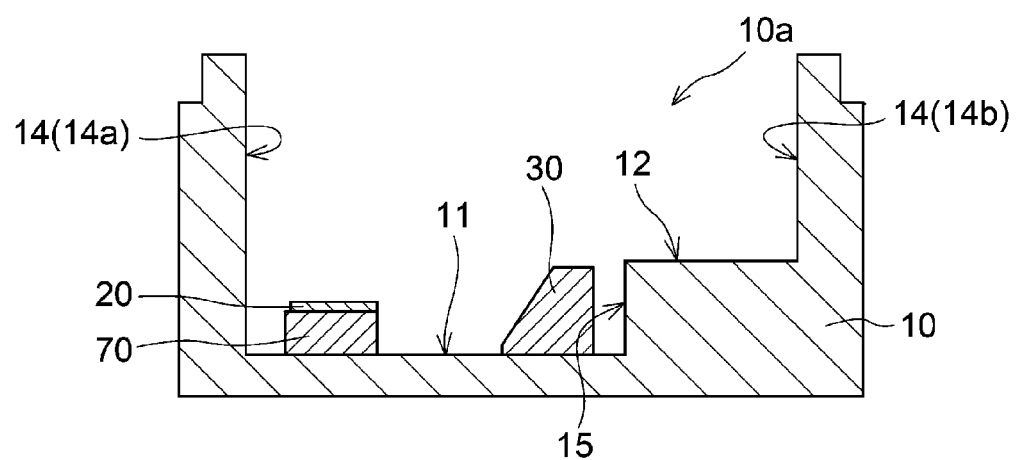
FIG. 3D is a schematic cross sectional view taken along line B-B in FIG. 3C.

FIGS. 1A to 1C are schematic diagrams each showing a light emitting device 1 according to a first embodiment. FIG. 1A is a schematic perspective view. FIG. 1B is a schematic top view. FIG. 1C is a schematic cross sectional view taken along line A-A in FIG. 1B. FIGS. 2A and 2B are schematic diagrams each showing the light emitting device 1 with a cover omitted. FIG. 2A is a schematic perspective view. FIG. 2B is a schematic top view. FIGS. 3A to 3D are schematic diagrams each showing a light emitting device 1 with the cover and a wavelength converting member omitted. FIG. 3A is a schematic perspective view. FIG. 3B is an enlarged view of a portion indicated by P in FIG. 3A. FIG. 3C is a schematic top view. FIG. 3D is a schematic cross sectional view taken along line B-B in FIG. 3C.

As shown in these figures, the light emitting device 1 includes a base 10 defining a recess 10a that opens upward, a semiconductor laser element 20 arranged on a bottom surface 11 of the recess 10a, a light reflecting member 30 arranged on the bottom surface 11 and configured to reflect light from the semiconductor laser element 20, a wavelength converting member 40 configured to convert wavelength of light from the light reflecting member 30, and a cover 50 covering the opening of the recess 10a and including a light-transmissive member 52 configured to transmit light from the wavelength converting member 40. The recess 10a of the base 10 is defined by first inner lateral surfaces 14 extending downward from a periphery of the opening of the recess 10a defined in an upper surface of the base 10, a bottom surface 11 connected to the first inner lateral surfaces 14, a mounting surface 12 located in a region different from the bottom surface 11 when viewed from above, the mounting surface 12 being connected to the first inner lateral surfaces 14 and located higher than the bottom surface 11, and second inner lateral surfaces 15 connecting the bottom surface 11 and the mounting surface 12. The wavelength converting member 40 is fixed to the mounting surface 12.

Light Emitting Device 1

The light emitting device 1 is, for example, an SMD type LD package. In the present specification, the "SMD type" refers to a surface-mounted device type, and the "LD" refers to a laser diode. SMD type LD packages can be used for automobile headlights, projectors, or the like.

Base 10

The base 10 defines the recess 10a opening upward. When viewed from above, the upper surface of the base 10 preferably has a substantially quadrangular outline having four sides. With this shape, the outline can be formed with substantially straight lines when viewed from above, which can facilitate bonding of the cover 50 and the base 10 by seam welding. In the present specification, the "upper surface of the base 10" refers to an uppermost surface of the base 10. That is, in FIG. 2A, a surface with hatching is the upper surface of the base 10. A quadrangular shape is an example, and the shape of the outline of the upper surface of the base 10 may be appropriately selected.

The base 10 includes, for example, a base body defining the recess 10a, a metal member arranged on an upper surface of the base body and to which the cover 50 is fixed, and an inner wiring. In order to improve corrosion-resistivity of the base 10, the base body is preferably made of, for example, a ceramic material such as aluminum nitride or aluminum oxide. The metal member contains iron as a main component, for example. The metal member is arranged surrounding the recess 10a and fixed on the upper surface of the base body by a silver solder or the like so that the upper surface of the metal member is the "uppermost surface of the base 10", which is described above. With the metal member arranged on the upper surface of the base body, the cover 50 can be fixed on the base 10 by welding, which can facilitate airtight sealing of the semiconductor laser element 20. In the base 10 of the present embodiment, aluminum nitride is used for the base body, and KOVAR® (nickel-cobalt ferrous alloy) is used for the metal member. The inner wiring is made of, for example, copper. The inner wirings are embedded in the base body, and electrically connect metal films 18 arranged on connecting surfaces 13, which are described below, and external electrodes 81 and 82, respectively.

Recess 10a

The recess 10a is defined by the first inner lateral surfaces 14 extending downward from periphery x1, x2, y1, and y2 of the opening of the recess 10a defined in the upper surface of the base 10, the bottom surface 11 connected to at least one of the first inner lateral surfaces 14, the mounting surface 12 located in a region different from the bottom surface when viewed from above, the mounting surface 12 being connected to the first inner lateral surfaces 14 and located higher than the bottom surface 11, and the second inner lateral surfaces 15 connecting the bottom surface 11 and the mounting surface 12.

The semiconductor laser element 20 and other members are to be arranged on the bottom surface 11, which limits reduction in the dimensions of the bottom surface 11. In the light emitting device 1, the mounting surface 12 is provided along a portion of the periphery of the opening of the recess defined in the upper surface of the base 10 (that is, a portion of "x1+x2+y1+y2") when viewed from above. With this arrangement, compared to the case where the bottom surface 11 has substantially a same planar dimension but the mounting surface 12 is provided along an entirety of the periphery of the opening of the recess defined in the upper surface of the base 10 (that is, "x1+x2+y1+y2"), the dimensions of the recess 10a when viewed from above can be reduced, so that the overall size of the light emitting device can be reduced.

In the description below, of the first inner lateral surfaces 14, "a region extending downward from the periphery of the opening of the recess defined in the upper surface of the base 10 and connected to the bottom surface 11" may also be referred to as a "first region 14a", and "a region extending downward from the periphery of the opening of the recess defined in the upper surface of the base 10 and connected to the mounting surface 12" may also be referred to as a "second region 14b".

In the case where the periphery of the opening of the recess defined in the upper surface of the base 10 has a substantially quadrangular shape when viewed from above, the mounting surface 12 is disposed along the entirety or a portion of one side, the entirety or a portion of two sides, or the entirety or a portion of three sides of four sides of the substantially quadrangular shape when viewed from above. In the present embodiment, as shown in FIG. 3A and FIG. 3C, the periphery of the opening of the recess defined in the upper surface of the base 10 has a substantially quadrangular shape having two long sides y1 and y2 and two short sides x1 and x2 when viewed from above. When viewed from above, the mounting surface 12 is disposed along one short side x1 and two long sides y1 and y2 of four sides x1, x2, y1, and y2 of the substantially quadrangular shape. The first inner lateral surfaces 14 include four surfaces (i.e., surfaces extending downward from x1, x2, y1, and y2). Of these four surfaces, at least a portion of one surface corresponds to the first region 14a, and portions of three surfaces correspond to the second region 14b. That is, the second region 14b refers to portions of the surfaces extending downward from three sides x1, y1, and y2 and connected to the mounting surface 12, and the first region 14a refers to a portion of the surface extending downward from one side x2 and connected to the bottom surface 11.

In the case where the mounting surface 12 is disposed along the three sides x1, y1, and y2 of the four sides x1, x2, y1, and y2, connecting area of the wavelength converting member 40 and the mounting surface 12 can be increased compared to the case where the mounting surface 12 is disposed along one or two sides of the four sides x1, x2, y1, and y2. With this arrangement, heat generated in the wavelength converting member 40 can be efficiently dissipated through the mounting surface 12. Also, with this arrangement, the three sides of the wavelength converting member 40 can be fixed to the mounting surface 12, so that the wavelength converting member 40 can be stably mounted on the mounting surface 12.

In the case where the mounting surface 12 is disposed along the three sides x1, y1, and y2 of the four sides x1, x2, y1, and y2, the mounting surface 12 is preferably disposed along a portion of each of the two opposing sides y1 and y2 of the three sides x1, y1, and y2, when viewed from above. That is, when viewed from above, two opposing sides y1 and y2 of three sides x1, y1, and y2 each includes a portion along the mounting surface 12 and a portion along the bottom surface 11. In this case, the portion along the bottom surface 11 is located on a lateral side of the semiconductor laser element 20. With this arrangement, regions (e.g., connecting surfaces 13 described below) for connecting wires can be secured on the lateral sides of the semiconductor laser element 20, so that a light reflecting surface of the semiconductor laser element 20 can be disposed near the first region 14a.

The mounting surface 12 is preferably parallel to the bottom surface 11. With this arrangement, the wavelength converting member 40 fixed on the mounting surface 12 can be substantially in parallel to the bottom surface 11 of the recess 10a, so that laser light reflected by the light reflecting member 30 can be easily irradiated to the wavelength converting member 40.

In view of securing a sufficient connecting area between the wavelength converting member 40 and the mounting surface 12, the mounting surface 12 preferably has a width of 0.5 mm or greater, more preferably 1 mm or greater when viewed from above. However, in view of miniaturizing the light emitting device 1, the mounting surface 12 preferably has a width of 3 mm or smaller, more preferably 2 mm or smaller when viewed from above. In the present specification, a width of the mounting surface 12 when viewed from above refers to the minimum of a distance between the periphery of the opening of the recess 10a and an inward periphery of the mounting surface 12.

Connecting Surfaces 13

In the recess 10a, the connecting surfaces 13, a third inner lateral surface 16 and a fourth inner lateral surface 17 each connecting to each of the connecting surfaces 13 may be provided. The connecting surfaces 13 are each located in a region different from the bottom surface 11 and the mounting surface 12 when viewed from above. Also, the connecting surfaces 13 are each connected to the first inner lateral surfaces 14. Further, the connecting surfaces 13 are located higher than the bottom surface 11 and lower than the mounting surface 12. Each of the third inner lateral surfaces 16 faces a lateral surface of the semiconductor laser element 20, and connects the bottom surface 11 and the connecting surface 13. Each of the third inner lateral surfaces 16 is connected in a planar manner to the second inner lateral surface 15. Each of the fourth inner lateral surfaces 17 connects the connecting surface 13 and the mounting surface 12. The semiconductor laser element 20 and the connecting surfaces 13 may be connected via the wires. The connecting surfaces 13 are located higher than the bottom surface 11 and lower than the mounting surface 12, so that the wires can be prevented from interfering with (i.e., touching) the wavelength converting member 40.

In the case where the periphery of the opening of the recess defined in the upper surface of the base 10 has a substantially quadrangular shape (with four sides x1, x2, y1, and y2) when viewed from above, the connecting surface 13 is preferably disposed along a side of the four sides along which the mounting surface 12 is disposed. In the case where the mounting surface 12 is disposed along two or more sides of the four sides, the connecting surface 13 is preferably disposed along at least one of the two or more sides. In the present embodiment, the connecting surfaces 13 are disposed along the two sides y1 and y2, respectively. That is, the first inner lateral surfaces 14 including the sides x1, y1, and y2, along which the mounting surface 12 is disposed when viewed from above, also include the second region 14b and at least one third region 14c connecting the periphery of the opening of the recess defined in the upper surface of the base 10 and the connecting surface 13. Further, the second region 14b is connected in a planar manner to the third region 14c. With this arrangement, a region along a portion where neither the mounting surface 12 nor the connecting surfaces 13 is present (that is, a region along the first region 14a) can serve as a portion of the bottom surface 11, so that an area of the bottom surface 11 required for disposing the semiconductor laser element 20 and other members can be secured. Accordingly, the semiconductor laser element 20 and other members can be arranged in the recess 10a without increasing the overall size of the entire light emitting device 1.

In the present embodiment, as shown in FIGS. 3A, 3B, and 3C, the mounting surface 12 and the connecting surfaces 13 are disposed along two long sides y1 and y2 of the periphery of the opening of the recess defined in the upper surface of the base 10. That is, the first inner lateral surfaces include four surfaces (i.e., surfaces extending downward from x1, x2, y1, and y2). A surface extending from the entirety of one short side x1 (i.e., the second region 14b) and the mounting surface 12 are connected. A surface extending downward from a portion of each of two long sides y1 and y2 (i.e., the second region 14b) and the mounting surface 12 are connected. A region extending downward from the other portion of each of two long sides y1 and y2 (i.e., the third region 14c) and the connecting surfaces 13 are connected. A surface extending downward from a portion of one short side x2 (i.e., the third region 14c) and the connecting surfaces 13 are connected. A surface extend downward from the other portion of the one short side x2 (i.e., the first region 14a) and the bottom surface 11 are connected.

The connecting surfaces 13 each has a height substantially the same as that of the upper surface of the semiconductor laser element 20. With this arrangement, wires of shorter lengths can be employed, which can facilitate connecting of the semiconductor laser element 20 and the connecting surfaces 13 by the wires. Also, the electric resistance of the wires can be reduced. The expression "same" in the description above includes the case where these heights are substantially the same (e.g., a height of the connecting surfaces 13 is in a range of ±0.5 mm relative to a height of the upper surface of the semiconductor laser element 20), as well as the case where these heights are completely the same.

Metal films 18 may respectively be arranged on each of the connecting surfaces 13. In this case, each of the connecting surfaces 13 is connected to each of the wires via each of the metal films 18. The metal films 18 may each contain a metal such as gold, silver, aluminum, titanium, platinum, nickel, and/or palladium. In the present embodiment, the metal films 18 are each made of gold.

Semiconductor Laser Element 20

The semiconductor laser element 20 is arranged on the bottom surface 11 of the recess 10a. Light emitted from the semiconductor laser element 20 advances in a direction substantially parallel to the bottom surface 11 of the recess 10a, and is reflected in a direction substantially perpendicular to the bottom surface 11 of the recess 10a by the light reflecting member 30.

While various kinds of semiconductor laser elements may be used for the semiconductor laser element 20, the light emitting device 1 can be suitably applied for the case where the semiconductor laser element 20 is made of a nitride semiconductor. A semiconductor laser element made of a nitride semiconductor has an oscillation wavelength relatively close to the ultraviolet region, and has a high light density in its light emitting surface, on which dust tends to collect. However, according to the light emitting device 1, the base 10 and the cover 50 are fixed to each other by welding, which can increase airtightness. Accordingly, the collection of dust as described above can be effectively reduced.

The semiconductor laser element 20 includes a light emitting surface, a light reflecting surface opposite to the light emitting surface, and lateral surfaces connecting the light emitting surface and the light reflecting surface. The light reflecting surface preferably faces the first region 14a.

That is, when viewed from above, the light reflecting surface preferably faces a portion of one side x2, which is one of four sides x1, x2, y1, and y2 of the substantially quadrangular shape, and along which the mounting surface 12 (the mounting surface 12 and the connecting surfaces 13, in the case where the connecting surfaces 13 are provided in the recess 10a) is absent. No member is arranged in a region between the light reflecting surface of the semiconductor laser element 20 and the first inner lateral surfaces 14 of the recess 10a. This arrangement described above allows placement of the light reflecting surface of the semiconductor laser 20 close to the first inner lateral surface 14 in the recess 10a, and thus, the light emitting device 1 can be miniaturized. In order to secure the mounting of the semiconductor laser element 20, the minimum distance between the light reflecting surface of the semiconductor laser element 20 and the first region 14a is preferably 0.1 mm or greater, and more preferably 0.2 mm or greater. However, in order to miniaturize the light emitting device 1, the minimum distance between the light reflecting surface of the semiconductor laser element 20 and the first region 14a is preferably 2 mm or smaller, more preferably 1 mm or smaller.

In the present embodiment, a submount 70 is optionally arranged on the bottom surface 11 of the recess 10a and the semiconductor laser element 20 is arranged on the submount 70. With this arrangement, the light emitting surface of the semiconductor laser element 20 can be arranged further away from the bottom surface 11 of the recess 10a than in the case where the semiconductor laser element 20 is directly arranged on the bottom surface 11 of the recess 10a. Accordingly, light from the semiconductor laser element 20 can be prevented from being incident on the bottom surface 11 of the recess 10a. Examples of the material of the submount 70 include aluminum nitride and silicon carbide. The semiconductor laser element 20 may be directly arranged on the bottom surface 11 of the recess 10a.

Light Reflecting Member 30

The light reflecting member 30 is arranged on the bottom surface 11 of the recess 10a, and is configured to reflect light from the semiconductor laser element 20. For the light reflecting member 30, for example, a member made of an optical glass in a triangular prism shape, a quadrangular truncated cone shape, or the like, and having a light reflecting film arranged on an inclined surface thereof can be used. The angle between the bottom surface 11 of the recess 10a and the inclined surface of the light reflecting member 30 (i.e., the surface of the optical glass with the light reflecting film) can be, for example, approximately 45°. The light reflecting member 30 of other appropriate structure may also be employed.

The light reflecting member 30 is disposed on a center portion of the recess 10a, and the wavelength converting member 40 is arranged directly above the inclined surface of the light reflecting member 30. In the case where the light emitting device 1 is miniaturized, the size of the recess 10a is decreased, so that light that is wavelength-converted by the wavelength converting member 40 may easily be incident on an inner lateral surface defining the recess 10a. This can be prevented by the arrangement of the light reflecting member 30 and the wavelength converting member 40 as described above. Note that such arrangement is an example, and the light reflecting member 30 or the wavelength converting member 40 may be arranged in any appropriate manner.

Any appropriate number of the light reflecting member 30 may be used. While light emitted from two semiconductor laser elements 20 is reflected by one light reflecting member 30 in a second embodiment described below, two light reflecting members 30 may be employed in accordance with the number of the semiconductor laser elements 20.

Wavelength Converting Member 40

The wavelength converting member 40 is fixed on the mounting surface 12, and is configured to convert a wavelength of light from the light reflecting member 30. The wavelength converting member 40 preferably includes a holding member 42 defining a through-hole 42a, and a phosphor-containing member 44 arranged in the through-hole 42a. Heat generated in the phosphor-containing member 44 is efficiently dissipated through the holding member 42.

For the holding member 42, a material having high thermal conductivity is preferably used in view of dissipation of the heat from the phosphor-containing member 44. Examples of such materials include metal materials containing such as copper, copper alloy, iron, or iron alloy, or ceramics materials containing such as aluminum nitride or aluminum oxide.

The holding member 42 is preferably a member that can reflect and/or absorb laser light oscillated by the semiconductor laser element 20. With the use of such a member, even if the wavelength converting member 40 is detached from the mounting surface 12 and the position of the wavelength converting member 40 is shifted, laser light can be reflected and/or absorbed by the holding member 42. Accordingly, leakage of laser light to the outside can be reduced.

For the phosphor-containing member 44, a sintered product of a phosphor or a sintered product of a phosphor containing a sintering aid can be used.

The phosphor can be selected from known materials, but it is preferable to select a material that allows for obtaining white light when combined with light emitted from the semiconductor laser element 20. For example, in the case where blue light is emitted from the semiconductor laser element 20, a phosphor that emits yellow light when excited by light emitted from the semiconductor laser element 20 can be used. Examples of a phosphor to emit yellow light include a YAG-based phosphor. In the case where light having shorter wavelength than that of blue light (e.g., ultraviolet light etc.) is emitted from the semiconductor laser element 20, phosphors that emit blue, green, and red light can be used.

For the sintering aid, silicon oxide, aluminum oxide, titanium oxide, or the like, can be used. Among those, aluminum oxide is particularly preferable. It is because aluminum oxide has a high melting point and has high durability against heat and light.

It is preferable that the wavelength converting member 40 has a width greater than a half of the width of the recess 10a, and has a length greater than a half of the length of the recess 10a when viewed from above. With this arrangement, even if the wavelength converting member 40 is detached and the position of the wavelength converting member 40 is shifted, laser light can be prevented from being directly emitted to the outside of the light emitting device 1. The term "width" as used above refers to a length in the right-and-left direction in FIG. 1B, and the term "length" as used above refers to a length in the up-and-down direction in FIG. 1B.

The wavelength converting member 40 preferably has a size that can cover 60% or more, more preferably 75% or more of the recess 10a, and even more preferably has the same size as the size of the recess 10a when viewed from above. With the wavelength converting member 40 of a size that can cover 60% or more or 75% or more of the recess 10a, laser light emitted from the semiconductor laser element 20 can be prevented from leaking to the outside of the light emitting device 1 without passing through the wavelength converting member 40. With the wavelength converting member 40 of a size that is the same as the size of the recess 10a, the optical path of laser light can be securely blocked in the case where the wavelength converting member 40 is maximally inclined in the recess 10a sealed by the cover 50, so that laser light can be prevented from being directly extracted to the outside. In the expression "the same (size)" as used above includes, as well as the case where the size of the wavelength converting member 40 has exactly the same dimensions as that of the recess 10a, the case where the size of the wavelength converting member 40 and that of the recess 10a have substantially the same dimensions. However, in the case where the wavelength converting member 40 and the recess 10a are designed to have exactly the same dimensions, the wavelength converting member 40 may have dimensions larger than the recess 10a due to deviation of accuracy in manufacturing, so that the wavelength converting member 40 cannot be arranged in the recess 10a. In view of this, it is preferable that the wavelength converting member 40 has a size substantially the same as the size of the recess 10a but slightly smaller than the size of the recess 10a (e.g., the size that can cover approximately 95% of the recess 10a).

In order to reduce the amount of light from the phosphor-containing member 44 that is absorbed by the holding member 42, a light-reflecting film containing silver, aluminum, or the like may be arranged between the holding member 42 and the phosphor-containing member 44. Also, on a lower surface of the wavelength converting member 40, a filter configured to transmit light from the semiconductor laser element 20 and reflect fluorescent from the phosphor-containing member 44 may be arranged. With this arrangement, wavelength-converted light can be reflected and extracted, so that the light extracting efficiency can be improved. Such a filter may be a dielectric multilayer film in which dielectric materials containing at least two of silicon oxide, niobium oxide, aluminum oxide, aluminum nitride, titanium oxide, etc., are layered. Further, in order to increase the heat-releasing area where heat from the wavelength converting member 40 is released, a light-transmissive body made of a glass, quartz, or sapphire may be arranged on a lower surface of the wavelength converting member 40.

Cover 50

The cover 50 is fixed on the upper surface of the base 10 to cover the opening of the recess 10a, and serves to retain the wavelength converting member 40 in the recess 10a of the base 10. With the base 10 and the cover 50, the light emitting device 1 is airtightly sealed.

The cover 50 includes a light-transmissive member 52 to transmit light from the wavelength converting member 40. For the light-transmissive member 52, a glass or the like can be used.

If the wavelength converting member 40 and the cover 50 are in contact with each other, stress is experienced on the cover 50 by heat generated in the wavelength converting member 40, which may break airtight sealing of the light emitting device 1. Accordingly, the minimum distance between an upper surface of the wavelength converting member 40 and a lower surface of the cover 50 is preferably 0.02 mm or greater, more preferably 0.1 mm or greater. However, in order to prevent laser light from being directly emitted to the outside of the light emitting device 1 in the case of the wavelength converting member 40 detaching from the mounting surface 12, the minimum distance between the upper surface of the wavelength converting member 40 and the lower surface of the cover 50 is preferably 0.5 mm or smaller, more preferably 0.25 mm or smaller.

The cover 50 preferably includes a holding member 54 defining a through-hole 54a. The opening area of the through-hole 54a at the light-incident side is larger than the opening area of the through-hole 42a at the light emission side. The light-transmissive member 52 is fixed at an inner side of the through-hole 54a of the holding member 54 of the cover 50 so as to close the through-hole 54a or is fixed on a surface of the holding member 54 of the cover 50 that is opposite side to the wavelength converting member 40 so as to cover the through-hole 54a of the holding member 54 of the cover 50. With this arrangement, the upper surface of the wavelength converting member 40 and the lower surface of the cover 50 can be arranged close to each other, so that light from the wavelength converting member 40 can be extracted easily through the light-transmissive member 52. For the holding member 54, a metal material containing KOVAR® (nickel-cobalt ferrous alloy) or the like can be used.

In the case where the cover 50 is made of only the light-transmissive member 52, the cover 50 can be fixed to the base 10 by an eutectic material. In the case where the cover 50 includes the light-transmissive member 52 and the holding member 54, the base 10 can be fixed to the holding member 54 by welding. With use of welding, the light-transmissive member 52 and the base 10 can be securely fixed to each other, which allows for providing the light emitting device 1 in which the cover 50 is hardly detached from the base 10 even when the light emitting device is subjected to a shock such as shaking.

It is preferable that the holding member 54 defines a recess 54b, and is fixed on the upper surface of the base 10 so that a portion of the recess 54b of the cover 50 is in the recess 10a of the base 10. In this case, the through-hole 54a of the holding member 54 is formed in a bottom surface of the recess 54b of the holding member 54, and the light-transmissive member 52 is arranged in the recess 54b of the cover 50. With this arrangement, members located outside of the light emitting device 1 are not easily brought in contact with the light-transmissive member 52, so that damage of the light-transmissive member 52 can be reduced. Also, the wavelength converting member 40 and the light-transmissive member 52 can be arranged close to each other, which allows for increasing the amount of light from the wavelength converting member 40 that passes through the light-transmissive member 52, so that light extraction efficiency of light from the wavelength converting member 40 can be increased.

In the present embodiment, the holding member 54 extends inward and bends to extend downward, and further bends and extends inward, thus, the recess 54b of the holding member 54 is formed. With this arrangement, stress generated due to difference in thermal expansion coefficient between the base 10 and the holding member 54 can be reduced by a portion of the holding member 54 that extends downward, so that plastic deformation of the holding member 54 and breakage of the light-transmissive member 52 can be reduced.

The light emitting device 1 includes external electrodes 81 and 82 to be electrically connected to the outside, at an upper side of the base 10. The external electrodes 81 and 82 are electrically connected to the metal films 18 via inner wirings of the base 10. In the present embodiment, when viewed from above, the external electrodes 81 and 82 and the connecting surfaces 13 are arranged close to each other across a portion of the periphery of the opening of the recess defined in the upper surface of the base 10. That is, when viewed from above, the external electrodes 81 and 82 and the connecting surfaces 13 are both arranged near the periphery of the opening of the recess defined in the upper surface of the base 10, more specifically, near the long sides y1 and y2, although they are different in whether they are at the inside or the outside of the recess 10a. With this arrangement, the distance between each of the external electrodes 81 and 82 and each of the corresponding connecting surfaces 13 can be decreased, which allows a decrease in the length of the inner wirings, so that the wiring resistance can be reduced.

The external electrodes 81 and 82 can be arranged so as not to protrude from the outline edge of the base 10 when viewed from above. With this arrangement, the light emitting device 1 can be obtained without increasing the overall size of the light emitting device. In the present embodiment, when viewed from above, a portion of the outline edge of the base 10 and a portion of each of the external electrodes 81 and 82 are matched so that the external electrodes 81 and 82 do not protrude from the outline edges of the base 10.

The external electrodes 81 and 82 are preferably disposed at a position that is lower than the upper surface of the base 10. With this arrangement, the external electrodes 81 and 82 are not easily brought in touch with the holding member 54 even in case of mounting misalignment, so that short-circuit between the external electrode 81 and the external electrode 82 via the holding member 54 can be prevented even in the case where the holding member 54 has electroconductivity. In the present embodiment, the bottom surface 11 of the recess 10a of the base 10 is lower than the upper surfaces of the external electrodes 81 and 82. With this arrangement, a distance between the bottom surface 11 of the recess 10a of the base 10 and the lower surface of the base 10 can be reduced, which can facilitate dissipation of heat generated in the semiconductor laser element 20.

For the external electrodes 81 and 82, for example, metal films can be used. The metal films may each contain, for example, gold, silver, aluminum, titanium, platinum, nickel, and/or palladium. The metal films used as the external electrodes 81 and 82 are preferably made of a similar material as the metal films 18 arranged on the connecting surfaces 13. With this arrangement, the external electrodes 81 and 82 and the metal films 18 can be collectively formed, so that manufacturing can be facilitated.

In the present embodiment, the light emitting device 1 has a substantially rectangular shape when viewed from above. The length of one side of the light emitting device 1 when viewed from above is preferably 5 mm or greater, more preferably 10 mm or greater in view of heat irradiation. However, the length one side of the light emitting device 1 is preferably 25 mm or smaller, more preferably 20 mm or smaller in order to miniaturize the light emitting device 1. Of the periphery of the opening of the recess defined in the upper surface of the base 10, the long sides y1 and y2 are each preferably 1 mm or greater, more preferably 2 mm or greater, in view of mounting the components such as the semiconductor laser element 20, thereon. However, of the periphery of the opening of the recess defined in the upper surface of the base 10, the long sides y1 and y2 are each preferably 15 mm or smaller, more preferably 10 mm or smaller in order to avoid an increase of the size of the light emitting device 1.

According to the light emitting device 1 described above, a small-sized light emitting device from which the wavelength converting member 40 is hardly detached can be provided. Accordingly, a small-sized light emitting device that is strong against shocks such as shaking and has high safety can be produced. Such light emitting device is suitable for, for example, automobile headlights.

Light Emitting Device According to Second Embodiment

Figure 4A:
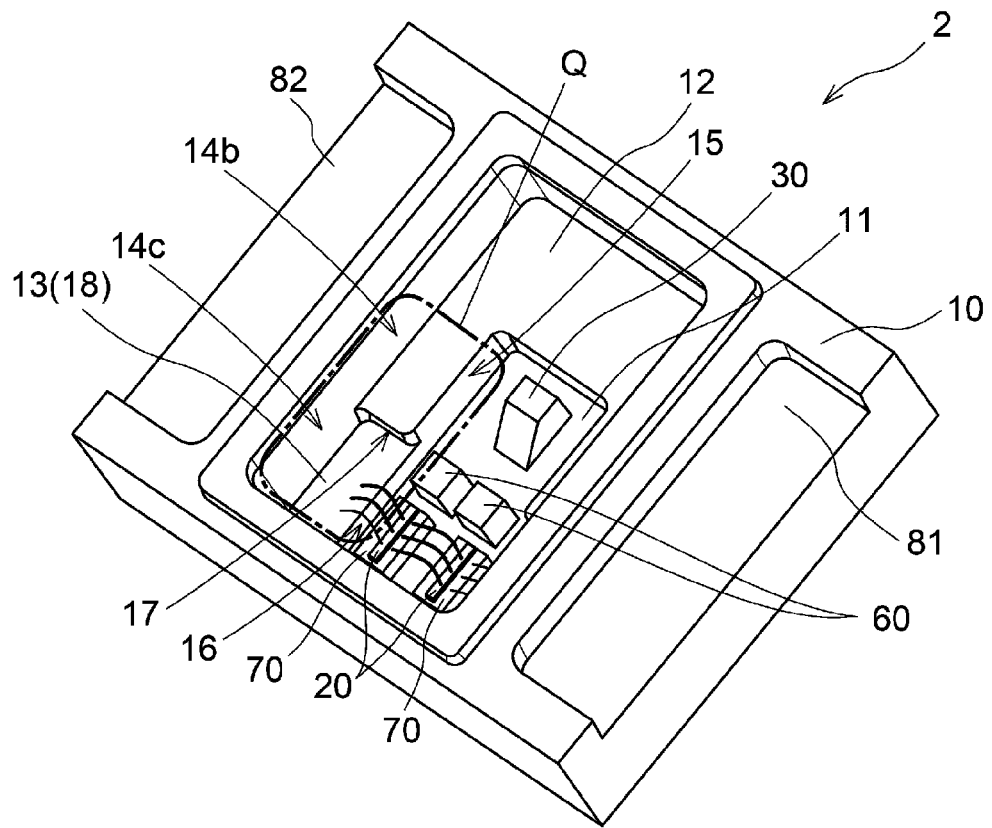
FIG. 4A is a schematic perspective view of a light emitting device according to a second embodiment (in which illustration of a cover and a wavelength converting member are omitted).
Figure 4B:
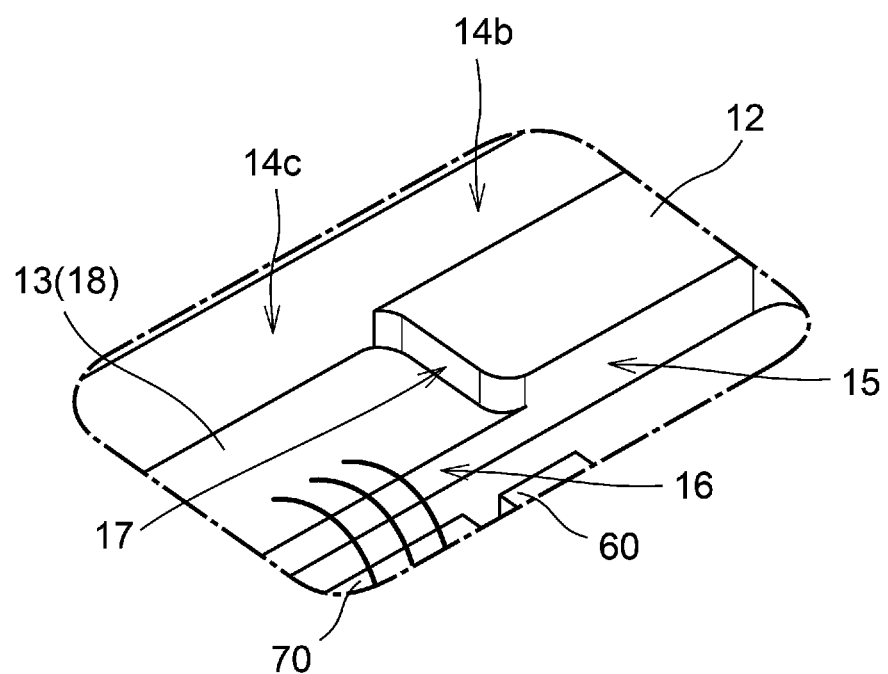
FIG. 4B is an enlarged view showing a section indicated by Q in FIG. 4A.
Figure 4C:
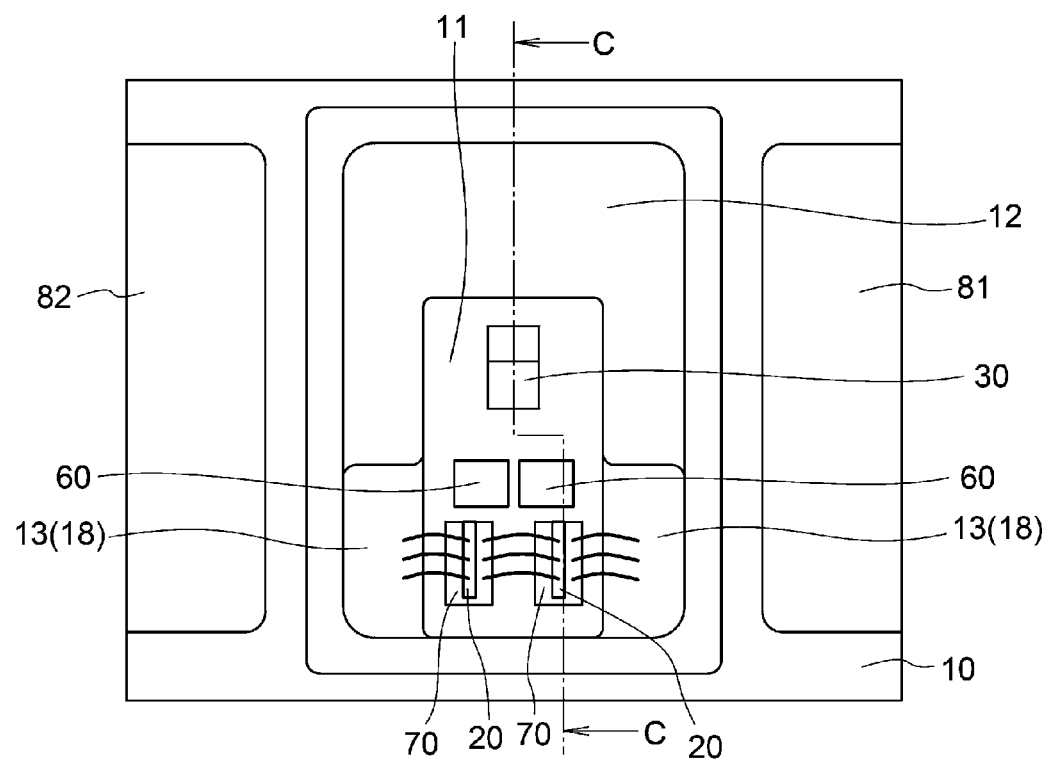
FIG. 4C is a schematic top view of the light emitting device according to the second embodiment (in which illustration of a cover and a wavelength converting member are omitted).
Figure 4D:
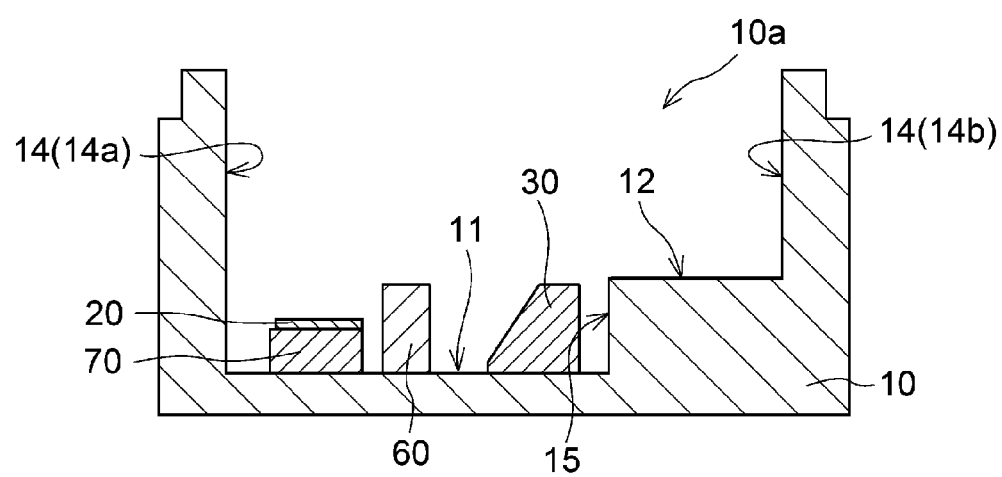
FIG. 4D is a schematic cross sectional view taken along line C-C in FIG. 4C.

FIGS. 4A to 4D are each schematic diagram showing a light emitting device 2 according to a second embodiment (in each of which illustrations of a cover and a wavelength converting member are omitted). FIG. 4A is a schematic perspective view. FIG. 4B is an enlarged view of a section indicated by Q in FIG. 4A. FIG. 4C is a schematic top view. FIG. 4D is a schematic cross sectional view taken along line C-C in FIG. 4C. As illustrated in FIGS. 4A to 4D, the light emitting device 2 includes a plurality of semiconductor laser elements 20, and at least one lens 60 is arranged so as to condense light emitted from the plurality of semiconductor laser element 20, which are different from the light emitting device 1 which includes one semiconductor laser element 20. According to the light emitting device 2 of the second embodiment, a light emitting device with high brightness can be obtained without increasing the overall size of the light emitting device.

In the present embodiment, the plurality of semiconductor laser elements 20 is arranged side by side in a direction perpendicular to the optical axis of each of the semiconductor laser elements 20 so that the light emission surfaces of the semiconductor laser elements 20 are in the same plane. Any appropriate type of lens that can condense laser light toward a light-reflecting member 30 can be employed as the lens 60. In the present embodiment, laser light is condensed by a collimating lens 60. In the present embodiment, one lens 60 is arranged for each one of the plurality of semiconductor laser elements 20, but one lens 60 may be arranged for the plurality of semiconductor laser elements 20.

It is to be understood that, although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A light emitting device comprising:
a base defining a recess that opens upward;
a semiconductor laser element arranged on a bottom surface of the recess;
a light reflecting member arranged on the bottom surface of the recess to reflect light from the semiconductor laser element;
a wavelength converting member to convert wavelength of light from the light reflecting member; and
a cover including a light-transmissive member to transmit light from the wavelength converting member, the cover covering an opening of the recess; wherein
the recess of the base includes:
first inner lateral surfaces extending downward from a periphery of the opening of the recess defined in the upper surface of the base;
a bottom surface connected to the first inner lateral surfaces;
a mounting surface located in a region different from the bottom surface when viewed from above, the mounting surface being connected to the first inner lateral surfaces and located higher than the bottom surface; and
second inner lateral surfaces connecting the bottom surface and the mounting surface, and the wavelength converting member is fixed on the mounting surface.

2. The light emitting device according to claim 1, wherein the wavelength converting member includes a holding member defining a through-hole and a phosphor-containing member arranged in the through-hole of the holding member.

3. The light emitting device according to claim 2, wherein the periphery of the opening of the recess defined in the upper surface of the base has a substantially quadrangular shape having four sides, and
the mounting surface is disposed along three sides of the substantially quadrangular shape when viewed from above.

4. The light emitting device according to claim 3, wherein the semiconductor laser element includes a light emitting surface, a light reflecting surface opposite to the light emitting surface, and lateral surfaces each connecting the light emitting surface and the light reflecting surface, and
the light reflecting surface faces one side of the substantially quadrangular shape along which the mounting surface is not present.

5. The light emitting device according to claim 4, wherein the recess of the base is defined by a connecting surface located in a region different from the bottom surface and the mounting surface when viewed from above, connected to the first inner lateral surfaces, and located higher than the bottom surface and lower than the mounting surface, a third inner lateral surface connecting the bottom surface and the connecting surface,
the third inner lateral surface faces a lateral surface of the semiconductor laser element, and
the semiconductor laser element and the connecting surface are connected via a wire.

6. The light emitting device according to claim 5, wherein the connecting surface is located at substantially the same height as an upper surface of the semiconductor laser element.

7. The light emitting device according to claim 5, further comprising:
an external electrode to be electrically connected to the outside at an upper side of the base, and
the external electrode is located lower than the upper surface of the base.

8. The light emitting device according to claim 7, wherein the external electrode and the connecting surface are arranged close to each other across a portion of the periphery of the opening of the recess defined in the upper surface of the base.

9. The light emitting device according to claim 4, wherein a distance between the reflecting surface of the semiconductor laser element and one side of the substantially quadrangular shape along which the mounting surface is absent is in a range of 0.1 mm to 2 mm.

10. The light emitting device according to claim 4, wherein
the wavelength converting member has a width greater than a half of a width of the recess, and
the wavelength converting member has a length greater than a half of a length of the recess of the base when viewed from above.

11. The light emitting device according to claim 4, wherein the light reflecting member is disposed on a center portion of the recess of the base.

12. The light emitting device according to claim 3, wherein the holding member of the wavelength converting member is made of a metal material or a ceramic material.

13. The light emitting device according to claim 1, wherein
the cover includes a holding member defining a through-hole, and
the light-transmissive member is fixed at an inner side of the through-hole of the holding member of the cover so as to close the through-hole or is fixed on a surface of the holding member of the cover that is opposite to the wavelength converting member so as to cover the through-hole of the holding member of the cover.

14. The light emitting device according to claim 13, wherein
the holding member of the cover defines a recess and is fixed on the upper surface of the base so that a portion of the recess of the cover is located in the recess of the base,
the through-hole of the holding member of the cover is arranged on a bottom surface of the recess of the holding member, and
the light-transmissive member is arranged in the recess of the cover.

15. The light emitting device according to claim 14, wherein the distance between an upper surface of the wavelength converting member and a lower surface of the cover is in a range of 0.02 mm to 0.5 mm.

16. The light emitting device according to claim 1, wherein the mounting surface has a width in a range of 0.5 mm to 3 mm.

17. The light emitting device according to claim 1, wherein the wavelength converting member has a size that can cover 60% or more of the area of the recess of the base when viewed from above.

18. The light emitting device according to claim 1, wherein the wavelength converting member has a size that is the same with the area of the recess of the base when viewed from above.

19. The light emitting device according to claim 1, further comprising:
at least one lens; and
the semiconductor laser element includes a plurality of the semiconductor laser elements; wherein
each of the at least one lens corresponds to each of the plurality of semiconductor laser elements.

20. The light emitting device according to claim 19, wherein the semiconductor laser element is arranged on the bottom surface of the recess of the base via a submount.

* * * * *